(12) United States Patent
Tung et al.

(10) Patent No.: US 11,262,135 B2
(45) Date of Patent: Mar. 1, 2022

(54) COOLING DEVICE

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 200 days.

(21) Appl. No.: 16/714,780

(22) Filed: Dec. 15, 2019

(65) Prior Publication Data
US 2021/0148643 A1    May 20, 2021

(30) Foreign Application Priority Data
Nov. 19, 2019 (CN) .......................... 201911137426.0

(51) Int. Cl.
*H05K 7/20* (2006.01)
*F28D 15/02* (2006.01)

(52) U.S. Cl.
CPC .................................. *F28D 15/02* (2013.01)

(58) Field of Classification Search
CPC ...... F28D 15/02; F28D 15/025; F24D 19/087; H05K 7/20381; H05K 7/203; H05K 7/20327; H05K 7/20336; H05K 5/068; H05K 5/0213; F28F 2265/12; H01L 23/4332; F16K 24/00; F16K 24/04; F16K 31/124; F16K 31/0603
See application file for complete search history.

(56) References Cited

U.S. PATENT DOCUMENTS

| | | | | |
|---|---|---|---|---|
| 1,705,721 A | * | 3/1929 | Dann | H01F 27/14 174/12 R |
| 2,288,341 A | * | 6/1942 | Addink | H01L 25/073 257/715 |
| 2,643,282 A | * | 6/1953 | Greene | H04B 1/03 174/15.1 |
| 2,882,449 A | * | 4/1959 | Beurtheret | H01J 7/24 315/118 |
| 3,245,248 A | * | 4/1966 | Ritter | G05D 23/1919 374/3 |
| 3,390,541 A | * | 7/1968 | Johnson | G01S 1/02 62/217 |

(Continued)

Primary Examiner — Travis Ruby
(74) Attorney, Agent, or Firm — CKC & Partners Co.. LLC

(57) ABSTRACT

A cooling device configured to cool a heat source includes a tank, a bellow and a solenoid valve. The tank contains a coolant, and the heat source is immersed in the coolant. The solenoid valve includes a first channel, a second channel, a third channel and a piston. The first channel is connected to the tank. The second channel is connected to the bellow. The third channel is connected to an external space. The piston is configured to seal the second channel and the third channel. The piston is configured to connect the first channel to one of the second channel and the third channel. When the heat source is initially activated, the piston is moved to connect the first channel to the third channel. When the heat source operates, the piston is moved to connect the first channel to the second channel.

9 Claims, 9 Drawing Sheets

(56) References Cited

U.S. PATENT DOCUMENTS

| | | | | |
|---|---|---|---|---|
| 3,934,453 | A * | 1/1976 | Hessen | H01F 27/14 73/19.11 |
| 3,989,102 | A * | 11/1976 | Jaster | F28D 15/00 165/104.31 |
| 4,201,319 | A * | 5/1980 | Andera | A61B 18/02 128/DIG. 27 |
| 4,253,518 | A * | 3/1981 | Minesi | F28D 15/06 165/104.27 |
| 4,330,033 | A * | 5/1982 | Okada | F25B 23/006 165/104.27 |
| 4,502,032 | A * | 2/1985 | Kimura | H01F 27/18 165/104.27 |
| 4,502,286 | A * | 3/1985 | Okada | F25B 23/006 165/104.21 |
| 4,608,831 | A * | 9/1986 | Gustafson | F17C 3/08 137/341 |
| 5,322,114 | A * | 6/1994 | Grabner | F28D 15/02 165/276 |
| 5,471,844 | A * | 12/1995 | Levi | F25D 3/105 257/E23.096 |
| 6,889,509 | B1 * | 5/2005 | Cader | G01R 31/2874 62/118 |
| 6,957,550 | B2 * | 10/2005 | Wyatt | F25B 23/006 165/104.33 |
| 2007/0193300 | A1 * | 8/2007 | Tilton | H01L 23/427 62/475 |
| 2007/0193721 | A1 * | 8/2007 | Tilton | F25B 43/04 165/104.19 |
| 2015/0060009 | A1 * | 3/2015 | Shelnutt | H05K 7/20809 165/11.1 |
| 2015/0070846 | A1 * | 3/2015 | Shelnutt | H05K 7/203 361/700 |
| 2015/0373882 | A1 * | 12/2015 | Smith | H05K 7/20809 361/679.46 |
| 2016/0242319 | A1 * | 8/2016 | Edwards | F04D 29/586 |
| 2016/0345461 | A1 * | 11/2016 | Smith | H05K 7/20818 |
| 2017/0127556 | A1 * | 5/2017 | Smith | H05K 5/068 |
| 2017/0295670 | A1 * | 10/2017 | Campbell | H05K 7/20236 |
| 2017/0303442 | A1 * | 10/2017 | Smith | H05K 7/20809 |
| 2018/0084670 | A1 * | 3/2018 | Hirai | H05K 7/20272 |
| 2018/0343774 | A1 * | 11/2018 | Smith | G06F 1/20 |
| 2019/0357378 | A1 * | 11/2019 | Kolar | F28D 1/0477 |
| 2019/0357379 | A1 * | 11/2019 | Kolar | H05K 7/20827 |

* cited by examiner

200

- 210 configure the piston at the second location between the first location and the third location inside the solenoid valve
- 215 confirm whether the heat source in the tank powers on
- 220 move the piston to the first location
- 225 confirm whether the temperature of the coolant in the tank is a first temperature less than the boiling point of the coolant
- 230 move the piston to the third location
- 235 monitor whether the pressure in the tank is greater than a selected threshold
- 240 confirm whether the heat source in the tank powers off
- 245 confirm whether the pressure in the tank is equal to the pressure of the external space
- 250 confirm whether the temperature of the coolant in the tank is a second temperature close to the room temperature
- 255 recover the piston back to the second position

Fig. 3

COOLING DEVICE

RELATED APPLICATIONS

This application claims priority to China Application Serial Number 201911137426.0, filed Nov. 19, 2019, which are herein incorporated by reference.

BACKGROUND

Field of Disclosure

The present invention relates to a cooling device. More particularly, the present invention is related to a two-phase immersion cooling device.

Description of Related Art

In an open two-phase immersion cooling system, the components to be cooled are immersed in a dielectric liquid. The dielectric liquid can be used as coolant. When the components heat up, the dielectric liquid will boil and have a phase change, and temperature of the component can be reduced through the phase change of the dielectric liquid.

During the cooling process, the dielectric liquid vaporizes, and the open two-phase immersion cooling system requires space to store the vaporized dielectric gas. However, in order to avoid damaging the components and maintain properties of the boiling point of the dielectric liquid, it is necessary to maintain the pressure in the tank at a normal pressure. Thus, the open two-phase immersion cooling system should collect the vaporized dielectric gas mixed with many other gases, and it takes up a lot of space for the open two-phase immersion cooling system.

Accordingly, how to provide a solution to solve the aforementioned problems becomes an important issue to be solved by those in the industry.

SUMMARY

To achieve the above object, an aspect of the present invention is related to a cooling device, which can improve the issues about the additional occupied space for a cooling device.

According to some embodiments of the present invention, a cooing device is configured to cool a heat source. The cooling device includes a tank, a bellow and a solenoid valve. The tank contains a coolant. The heat source is immersed in the coolant. The solenoid valve is connected to the tank and the bellow. The solenoid valve includes a first channel, a second channel, and third channel and a piston. The first channel is connected to the tank. The second channel is connected to the bellow. The third channel is connected to an external space. The piston is configured to seal the second channel and the third channel. The piston is configured to connect the first channel to one of the second channel and the third channel. When the heat source is initially activated, the piston is moved to connect the first channel to the third channel. When the heat source operates, the piston is moved to connect the first channel to the second channel.

In one or more embodiments of the present invention, the cooling device further includes a temperature sensor. The temperature sensor is connected to the tank. The temperature sensor is configured to detect a temperature of the coolant. In some embodiments, the cooling device further includes a processor connected to the solenoid valve. The processor is configured to control a position inside the solenoid valve according to the temperature of the coolant. The piston is moved to connect the first channel to the second channel when the temperature of the coolant reaches a threshold temperature.

In one or more embodiments of the present invention, the cooling device further includes a pressure sensor. The pressure sensor is connected to the tank. The pressure sensor is configured to detect a pressure in the tank. In some embodiments, the cooling device further includes a processor connected to the solenoid valve. The processor is configured to control a position inside the solenoid valve according to pressure in the tank. The piston is moved to connect the first channel to the third channel when the pressure in the tank reaches a threshold value.

In one or more embodiments of the present invention, the cooling device further includes a valve chamber. The valve chamber is fluidally communicated with the first channel, the second channel and the third channel. The first channel and the third channel are respectively disposed at two opposite side of the valve chamber. The piston is configured to separate the valve chamber into a first chamber and a second chamber that are fluidally isolated from each other.

In one or more embodiments of the present invention, the solenoid valve having the valve chamber further includes a coil and a magnet group. The coil is configured outside the valve chamber and connected to the piston. The magnet group is configured outside the valve chamber to couple to the coil. When the power of the solenoid valve is turned on, current flows the coil, and it causes that the coil to be repelled by the magnet group to drive the piston to move.

In some embodiments, the piston is configured to be moved to a first location, a second location or the third location of the valve chamber. When the piston is at the first location, the piston is configured to seal the second channel to connect the first channel to the third channel. When the piston is at the second location, the piston is configured to seal the first channel. When the piston is at the third location, the piston is configured to seal the third channel to connect the first channel to the second channel.

In some embodiments, the cooling device further includes a processor connected to the solenoid valve. The processor is configured to cause the piston to be located at one of the first location and the third location when the solenoid valve powers on.

In some embodiments, the cooling device further includes a processor connected to the solenoid valve. The processor is configured to cause the piston to be located at a sealing position where the piston seals the first channel. The first chamber is connected to the second channel and the second chamber can be connected to the third channel.

To achieve the above object, another aspect of the present invention is related to a cooling device. According to one or more embodiments of the present invention, a cooling device includes a tank, a bellow, a first solenoid valve and a second solenoid valve. The tank contains a coolant. The first solenoid valve connects the tank to the bellow and is configured to cause the tank to be selectively communicated with the bellow. The second solenoid valve is connected to the tank and is configured to cause the tank to be selectively communicated with an external space.

In summary, through the control and adjustment of the solenoid valve, the tank of the cooling device can exclude gases other than the vaporized coolant, and the space required by the bellow of the cooling device is saved. As the internal pressure in the tank needs to be adjusted to a normal pressure, the solenoid valve can make the tank communicate with the external space to supplement external gas. Most of these external gases can be removed by the solenoid valve.

It is to be understood that both the foregoing general description and the following detailed description are by examples, and are intended to provide further explanation of the invention as claimed.

BRIEF DESCRIPTION OF THE DRAWINGS

In order to make the above and other objects, features, advantages, and embodiments of the present invention more comprehensible, the description of the drawings is as follows:

FIG. 3 illustrates a flow chart of an operation method of a solenoid valve of a cooling device according to one embodiment of the present invention;

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the invention.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

As described above, a two-phase immersion cooling device can reduce the temperature of the heating components through the phase change of the coolant contained in the tank. The heating components are placed in the coolant of the tank. To maintain the pressure in the tank at a normal pressure, the vaporized coolant stored in the bellow often mixes other gases, thus occupying a lot of space. In order to improve the above problem, the design of the solenoid valve of the present invention can effectively reduce the space occupied by the bellow.

Figure 1:
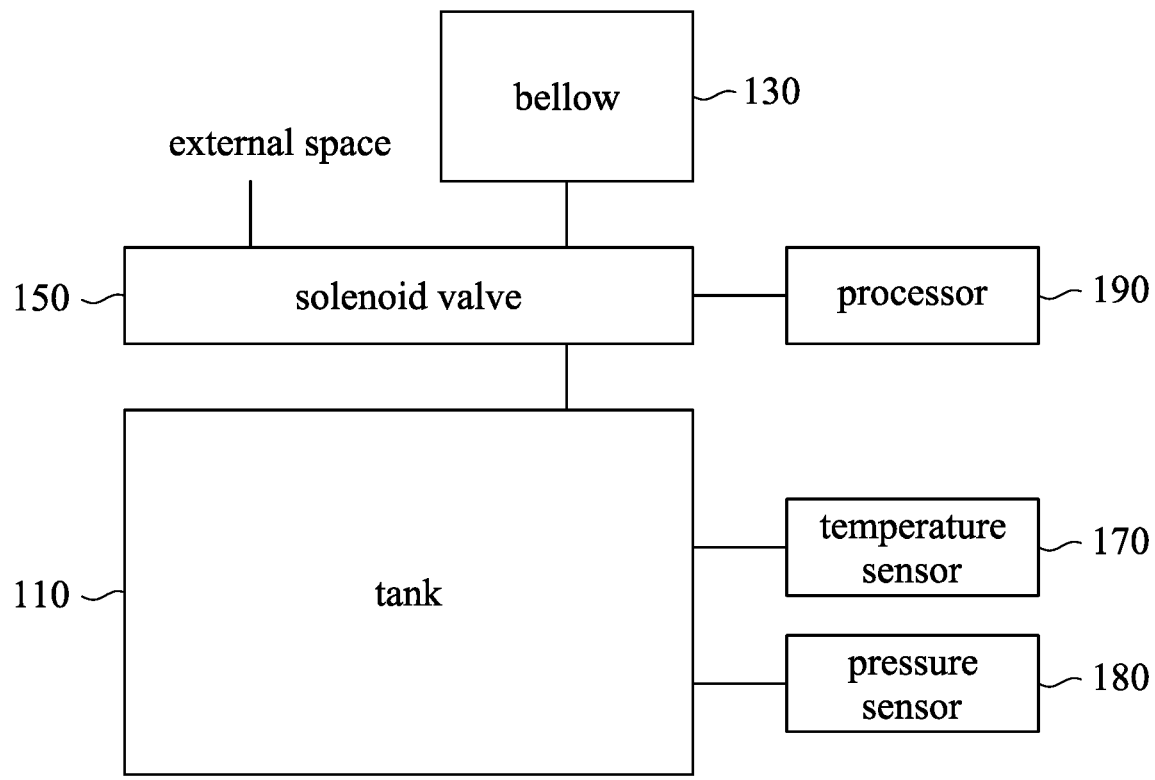
FIG. 1 illustrates a schematic block diagram of a cooling device according to one embodiment of the present invention.
Figure 2A:
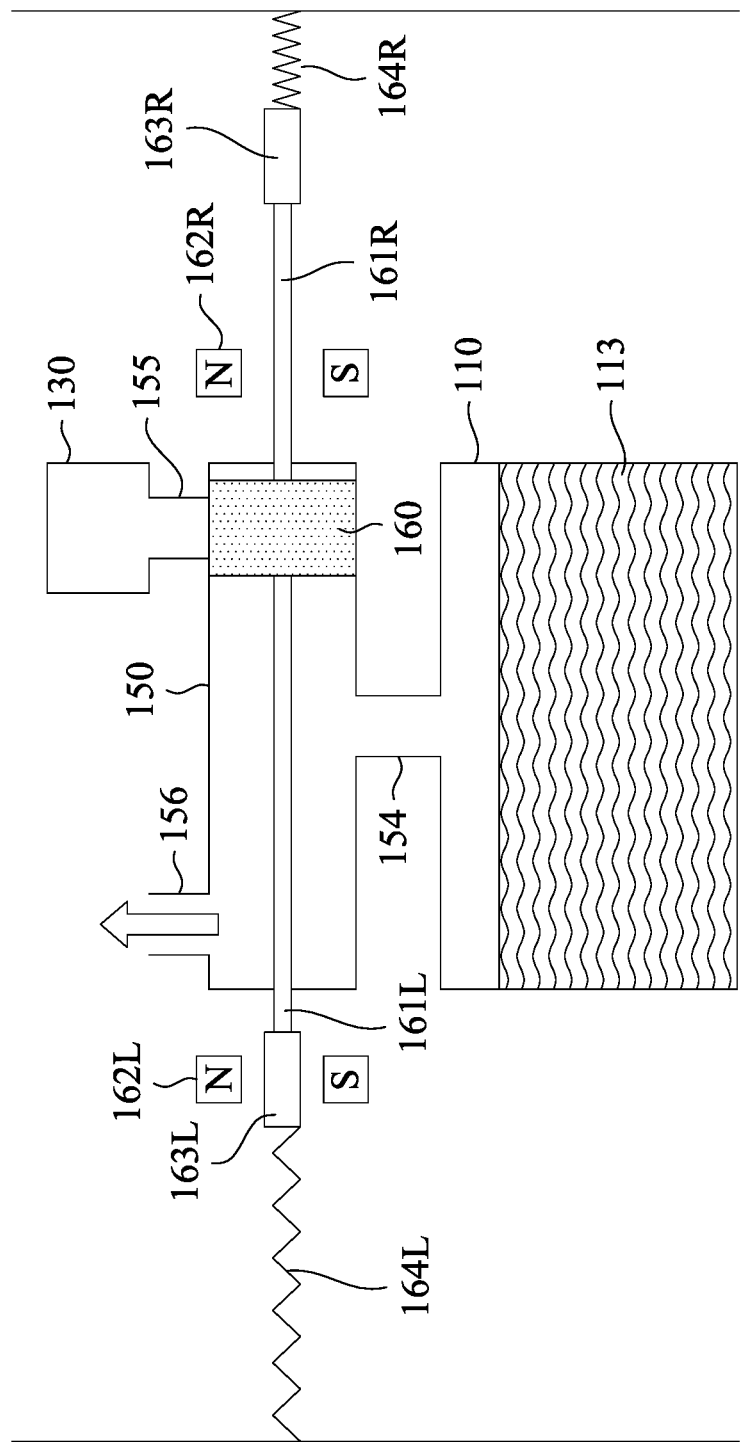
FIGS. 2A-2C are schematic views respectively illustrating the piston of the solenoid valve at a first location, a second location, and a third location in a cooling device according to an embodiment of the present invention to illustrate the operation of the cooling device.

Please refer to FIG. 1 and FIG. 2A. FIG. 1 illustrates a schematic block diagram of a cooling device 100 according to one embodiment of the present invention. FIG. 2A is a schematic diagram further illustrating a specific structure of the cooling device 100. In FIG. 1, the cooling device 100 includes a tank 110, a bellow 130 and a solenoid valve 150. The tank 110 and the bellow 130 are connected by the solenoid valve 150 there between. The solenoid valve 150 can be connected to an external space, and the pressure in the tank 110 can be controlled by the communication between the tank 110 and the bellow 130 or the external space.

FIG. 2A further illustrates the specific structure of the cooling device 100. The tank 110 contains a coolant 113. In this embodiment, the solenoid valve 150 is a three-hole three-position solenoid valve. The solenoid valve 150 includes a first channel 154, a second channel 155, a third channel 156 and a piston 160. The first channel 154 is connected to the tank 110 but not used to conduct liquid coolant 113. The second channel 155 is connected to the bellow 130, and the third channel 156 is connected to an external space. The solenoid valve 150 has a valve chamber therein. The first channel 154, the second channel 155, and the third channel 156 are all fluidally communicated with the valve chamber, and the piston 160 is provided in the valve chamber to separate the valve chambers into two isolated chambers. The two chambers are fluidally isolated from each other so that the second channel 155 and the third channel 156 are isolated from each other. Taking FIG. 2A as an example, the piston 160 seals the second channel 155, the solenoid valve 150 substantially communicates with the first channel 154 and the third channel 156, and the tank 110 is communicated with the external space. For the other operations of the pistons 160 and solenoid valves 150, please refer to following discussions.

In the cooling device 100, a heat source to be cooled is configured in the tank 110 and immersed in the coolant 113. The heat source is, for example, a server system including heating components. The coolant 113 is, for example, a dielectric liquid, which prevents an unexpected short between components of the heat source. When the system components to be cooled generate heat, the heat is transferred to the coolant 113, the temperature of the coolant 113 is increased, and it cause that the coolant 113 have a phase change to be vaporized. As the phase of the coolant 113 changes, the components of the heat source are also cooled. For simplicity, the heat source to be cooled is not shown in the cooling device 100.

The piston 160 is movably configured in a valve chamber of the solenoid valve 150. In this embodiment, the piston 160 can be moved by being connected to the spring 164L and the spring 164R. As shown in FIG. 2A, one side of the piston 160 is connected to one end of the connecting rod 161L, and the other end of the connecting rod 161L is penetrated from the valve chamber of the solenoid valve 150 and connected to the coil 163L. The magnet group 162L includes N and S poles, and the coil 163L can be configured between the N and S poles of the magnet group 162L. The spring 164L is connected to the connecting rod 161L through a coil 163L. Similar settings are also applied to the connecting rod 161R, the magnet group 162R, the coil 163R, and the spring 164R.

The coil 163L and the coil 163R are, for example, a spiral coil wound with a conductive metal wire. The coil 163L and the coil 163R can be connected to a power source of the solenoid valve 150. Taking FIG. 2A as an example, when the power of the solenoid valve 150 is turned on, current can flow through the coil 163R to cause a repulsive force between the coil 163R and the magnet group 162R. Accordingly, the generated repulsive force can move the coil 163R away from the magnet group 162R, so that the spring 164R is compressed, and the driven piston 160 further closes the second channel 155. When the power of the solenoid valve 150 is turned off, the coil 163R loses repulsion from the magnet groups 162R, and the compressed spring 164R will be able to push the piston 160, and the piston 160 returns to the original position.

The specific manner of moving the piston 160 in the solenoid valve 150 in this embodiment is described above. Please return to FIG. 1. In this embodiment, the cooling device 100 further includes a temperature sensor 170, a pressure sensor 180 and a processor 190. For simplifying, these elements are not shown in FIG. 2A. Through these components, users can further design a process to control the movement of the piston 160 according to the operation of the cooling device 100.

In FIG. 1, the temperature sensor 170 and the pressure sensor 180 are connected to the tank 110 respectively. The temperature sensor 170 is configured to sense the temperature of the coolant 113 in the tank 110. For example, when the temperature of the coolant 113 is near the boiling point of the coolant 113, the temperature sensor 170 can send a signal to the processor 190. The pressure sensor 180 is configured to sense the pressure in the tank 110. For example, when the pressure rises to a threshold value that deviates from the normal pressure, the pressure sensor 180 can send a signal to the processor 190. The processor 190 is connected to the solenoid valve 150. When the power of the solenoid valve 150 is turned on, the processor 190 can choose to conduct one of the coil 163L and the coil 163R according to the received signal, so that the piston 160 can close one of the second channel 155 and the third channel 156. When the power of the solenoid valve 150 is turned off, the springs 164L and 164R are not compressed by the repulsive force from the coils 163L and 163R, so that the piston 160 is maintained in an equilibrium position. The equilibrium position can be determined by the air pressure of the two chambers separated by the piston 160. For details, please refer to the following discussion.

Figure 2B:
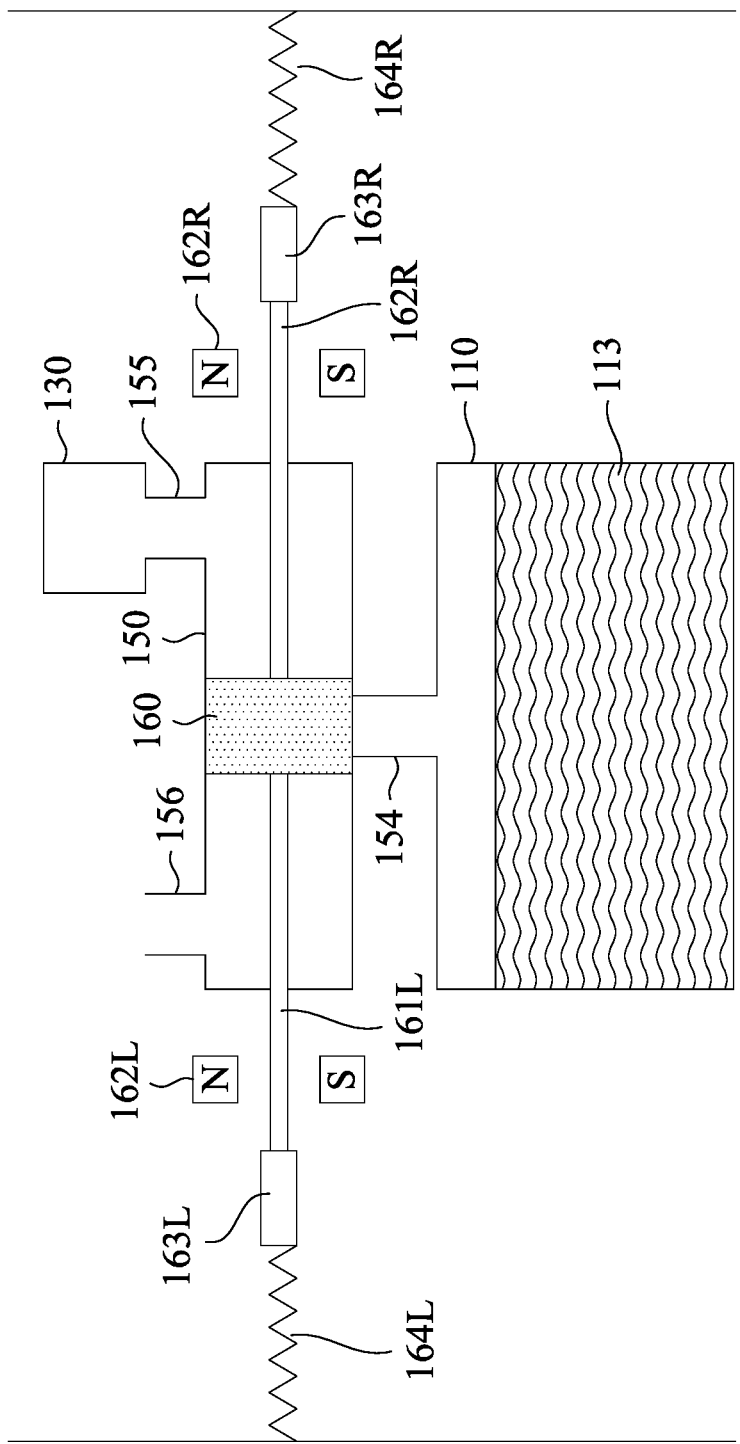
Figure 2C:
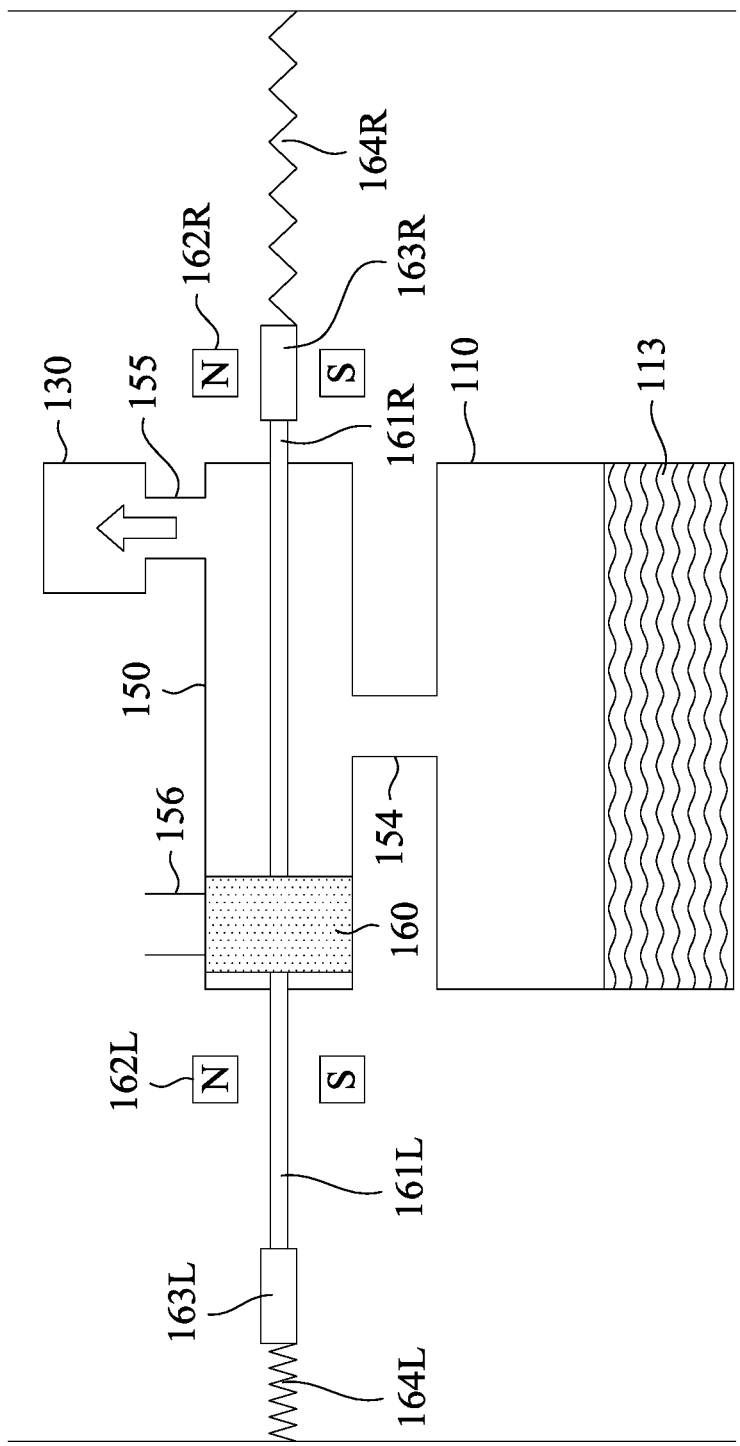

Please refer to FIGS. 2A to 2C. In addition to further illustrating the structure of the cooling device 100, FIGS. 2A to 2C respectively illustrate the situations that the piston 160 of the solenoid valve 150 is at the first location, the second location, and the third location when the cooling device 100 operates.

In FIG. 2A, the piston 160 is located at the first location. Refer to the foregoing description, when the power of the solenoid valve 150 is turned on, the coil 163R is conducted, a repulsive force is generated between the coil 163R and the magnet group 162R, and the piston is moved to the first location of seal the second channel 155. The first channel 154 communicates with the third channel 156. Therefore, the gas can flow out into the external space as shown by the arrow in FIG. 2A.

In FIG. 2B, the piston 160 is at the second location. Refer to the foregoing description, when the power of the solenoid valve 150 is turned off, the springs 164L and 164R will not be compressed by the repulsive force from the coils 163L and 163R, so that the piston 160 is maintained in an equilibrium position. As shown in the FIG. 2B, the first channel 154 is sealed by the piston 160, and the valve chamber in the solenoid valve 150 is divided by the piston 160 into two chambers that are fluidally isolated from each other. In FIG. 2B, the external space communicates with the separated chamber on the left side of the piston 160 through the third channel 156, and the bellow 130 communicates with the space on the right side of the piston 160 through the second channel 155. The first channel 154 is basically sealed, and the chamber on the left side of the piston 160 fluidally communicated with the external space is at a normal pressure. When there is a pressure difference between the left and right sides of the piston 160, the piston 160 is moved to a new equilibrium position. For example, when too much gas remains in the bellow 130, the separated chamber on the right side of the piston 160 in FIG. 2B has a large pressure such that the piston 160 is moved to the left, and the pressure in the chamber on the right side of the piston 160 is decreased.

In FIG. 2C, the piston 160 is located in the third location. When the power of the solenoid valve 150 is turned on, the coil 163L is conducted, and a repulsive force is generated between the coil 163R and the magnet group 162L. The coil 163L is far from the magnet group 162R, and then the piston 160 is moved to the third location to close the third channel 156. The first channel 154 communicates with the second channel 155. Therefore, the gas can flow into the bellow 130 as shown by the arrows in FIG. 2C.

Please refer to FIG. 3 and FIGS. 2A to 2C. FIG. 3 is a flow chart illustrating a method 200 for operating the solenoid valve 150 of the cooling device 100 according to an embodiment of the present invention. Taking the operation method 200 described in FIG. 3 as an example, it can be specifically explained that how the cooling device 100 save the occupied space. For example, in this embodiment, the operations are executed by the processor 190 connected to the solenoid valve 150 as shown in FIG. 1.

It should be noted that the heat source to be cooled is provided in the coolant 113 and immersed in the tank 110, and is not shown in the figures for simplifying. In addition, in order to avoid damage to the components of the heat source to be cooled, or an unexpected deviation of the performance of the coolant 113 due to pressure changes, the pressure of the tank 110 is usually maintained at a normal pressure. Normal pressure is, for example, one atmosphere.

Please refer to FIG. 3. In the operation 210, cooling process is not activated. As shown in FIG. 2B, the power of the solenoid valve 150 is turned off, and the piston 160 is in the second location.

Continued with operation 210, in the process 215, it is confirmed whether the heat source to be cooled in the tank 110 powers on and starts generating heat.

If so, it continues to operation 220, and the power of the solenoid valve 150 is turned on. As shown in FIG. 2A, the processor 190 controls the piston 160 to be moved to the first location. When the heat source (for example, the server system) to be cooled is initially activated, and the first channel 154 communicates with the third channel 156, such that the tank 110 communicates with the external space. When the heat source to be cooled is initially activated, the heat source immersed in the coolant 113 has not released a large amount of heat, and the temperature of the coolant 113 in the tank 110 is still close to normal temperature. In some embodiments, it can be defined that when the temperature of the coolant 113 is lower than a startup temperature, the heat source to be cooled is initially activated. For example, the starting temperature can be a first temperature close to but below the boiling point of the coolant 113. In order to keep the pressure in the tank 110 at a normal pressure, the gas in the tank 110 is mainly a mixed gas including vaporized coolant 113 with a low concentration. In the operation 220, the low-concentration mixed gas is discharged out of the tank 110 through the control of the solenoid valve 150. Therefore, the occupied space of the bellow 130 is zero.

As the heat source to be cooled generates heat, the temperature of the coolant 113 in the tank 110 increases. Proceed to operation 225, by the temperature sensor 170 connected to the tank 110, it is confirmed whether the temperature of the coolant 113 in the tank 110 reaches a first temperature close to but lower than the boiling point. Because the vapor pressure of a liquid is positively related to temperature, when the liquid temperature approaches the boiling point, its vapor pressure also approaches one atmosphere. Thus, when the temperature of the coolant 113 approaches the boiling point, the gas in the tank 110 can be regarded as a mixed gas having a high concentration of the vaporized coolant 113.

In order to reduce the loss of the coolant 113, after confirming that the temperature of the coolant 113 reaches a first temperature close to but lower than the boiling point, the process proceeds to operation 230, and the piston 160 of the solenoid valve 150 is placed to the third location as shown in FIG. 2C. In other words, the heat source to be cooled leaves the initially activated stage and enters normal operation. The temperature of the coolant 113 is increased to a temperature greater than the first temperature due to the heat released by the normal operation of the heat source. In operation 230, the tank 110 is communicated with the bellow 130, and the mixed gas having the high vapor concentration of the vaporized coolant 113 is stored in the bellow 130. Since the low-concentration mixed gas before the boiling of the coolant 113 is excluded, the required volume for the bellow 130 is reduced with respect to an original design of an open two-phase immersion cooling system, and the overall heat source heat density can be increased.

When the heat source to be cooled operates in the tank 110, the piston 160 is maintained at the third location, and the bellow 130 can continuously collect mixed gas having a high vapor concentration of the vaporized coolant 113. When the heat production of the heat source to be cooled changes such that the production of the vaporized coolant 113 also changes, the pressure difference between the bellow 130, the tank 110 and the external space can be used to cause the mixed gas moving between the tank 100 and the bellow 130 without other external force to maintain the pressure in the tank 110 at a normal pressure. The heat source to be cooled can be, for example, a server, which includes a central processing unit (CPU), a baseboard management controller, a memory, a hard disk, an expansion card, and the like.

Figure 4:
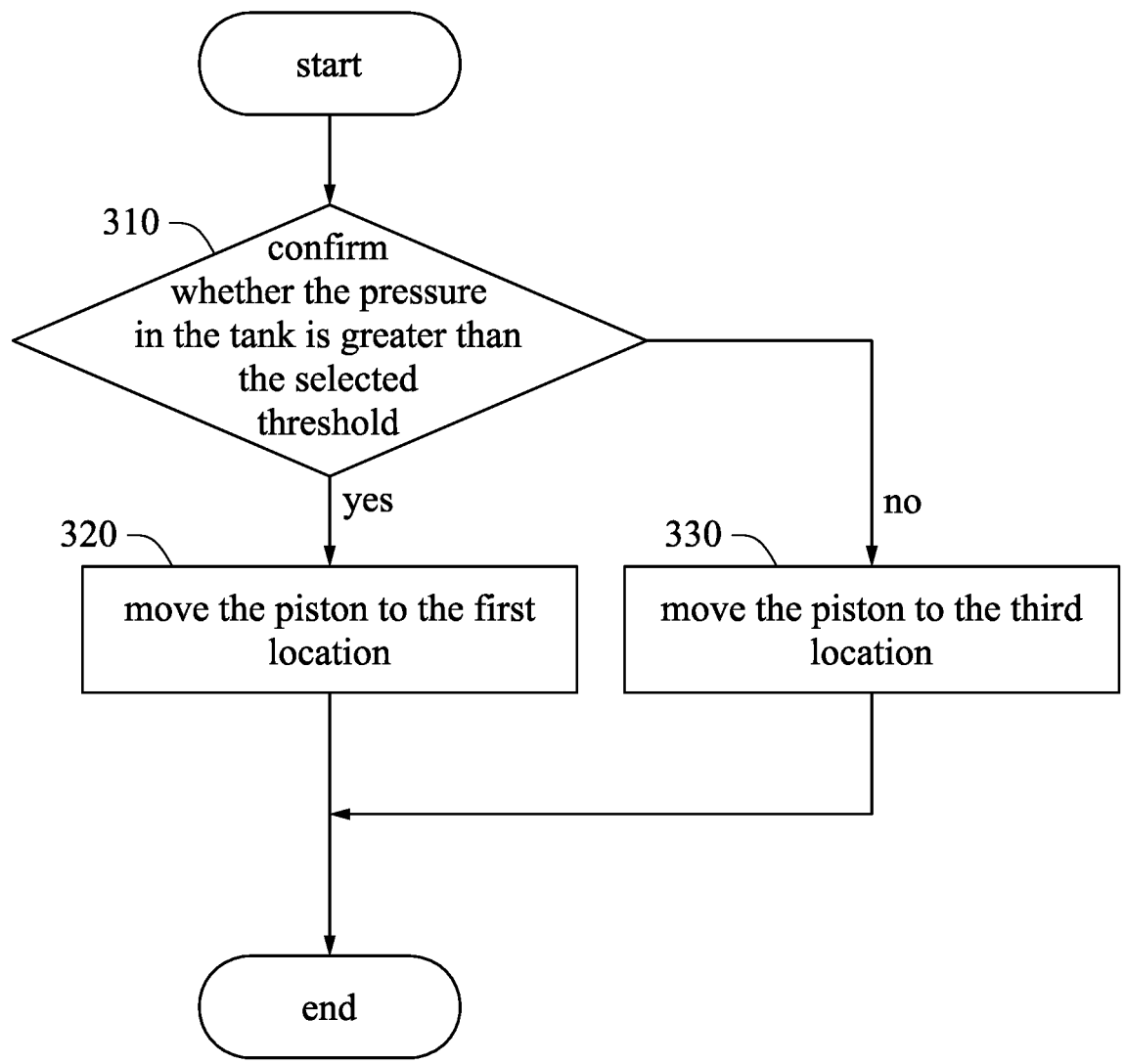
FIG. 4 is a flow chart illustrating that how the mechanism of the changing pressure in the tank of the cooling device is monitored according to one embodiment of the present invention.

While the heat source to be cooled continues to operate, proceed to operation 235 to monitor whether the air pressure in the tank 110 is greater than a selected threshold. For details, please refer to FIG. 4, and it explains the monitoring security mechanism 300 in the operation 235. As shown in FIG. 4, after entering the operation 235, the security mechanism 300 is activated. By connecting the pressure sensor 180 of the tank 110, the process 310 confirms whether the pressure in the tank 110 is greater than a selected threshold. If the pressure in the tank 110 exceeds a selected threshold, the heat source to be cooled can be damaged, so that the security mechanism 300 enters the process 320 to move the piston 160 in the solenoid valve 150 to the first location (see FIG. 2A), the tank 110 communicates with the external space, and it reduces the pressure in the tank 110. The security mechanism 300 can be repeatedly executed until the process 310 confirms that the pressure in the tank 110 does not exceed the selected threshold, enters the process 330 and moves the piston 160 in the solenoid valve 150 to the third location (see FIG. 2C).

The operation 235 continues until the heat source to be cooled powers off. Proceed to operation 240 to confirm whether the heat source to be cooled in the tank 110 is turned off. If so, proceed to operation 245 and first confirm whether the pressure in the tank 110 returns to the air pressure in the external space through the pressure sensor 180. In other words, it is confirmed whether the pressure in the tank 110 is equal to the pressure of the external space. If not, keep the piston 160 in the third location to avoid wasting the vaporized coolant 113. If yes, continue to operation 250.

In operation 250, it is confirmed whether the temperature of the coolant 113 in the tank 110 has been reduced to a second temperature, which is close to the room temperature (e.g. the pressure of the external space). If so, continue to operation 255, and the processor 190 can return the piston 160 to the second location by turning off the conduction of the coils 163L and 163R (as shown in FIG. 2B). In operation 255, the first channel 154 is sealed by the piston 160, and the vaporized coolant 113 vapor from the tank 110 will not be lost.

Through the method 200, the cooling device 100 can be controlled by the solenoid valve 150 to eliminate low-concentration mixed gas that does not need to be stored in the bellow 130, so that the space required by the bellow 130 can be reduced.

Figure 5A:
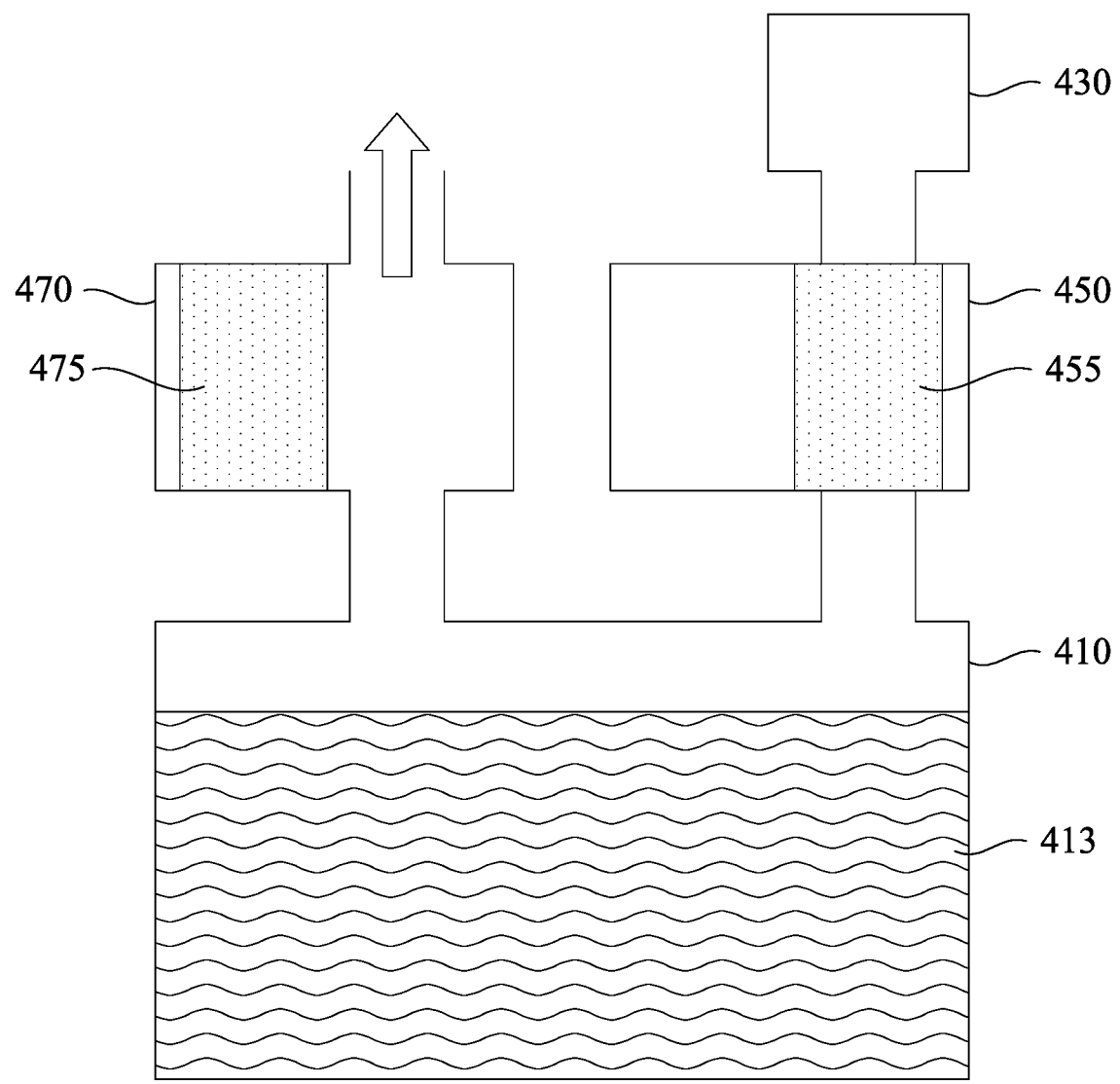
FIGS. 5A-5C are schematic views respectively illustrating pistons of solenoid valves at a first location, a second location, and a third location in another cooling device according to an embodiment of the present invention.
Figure 5B:
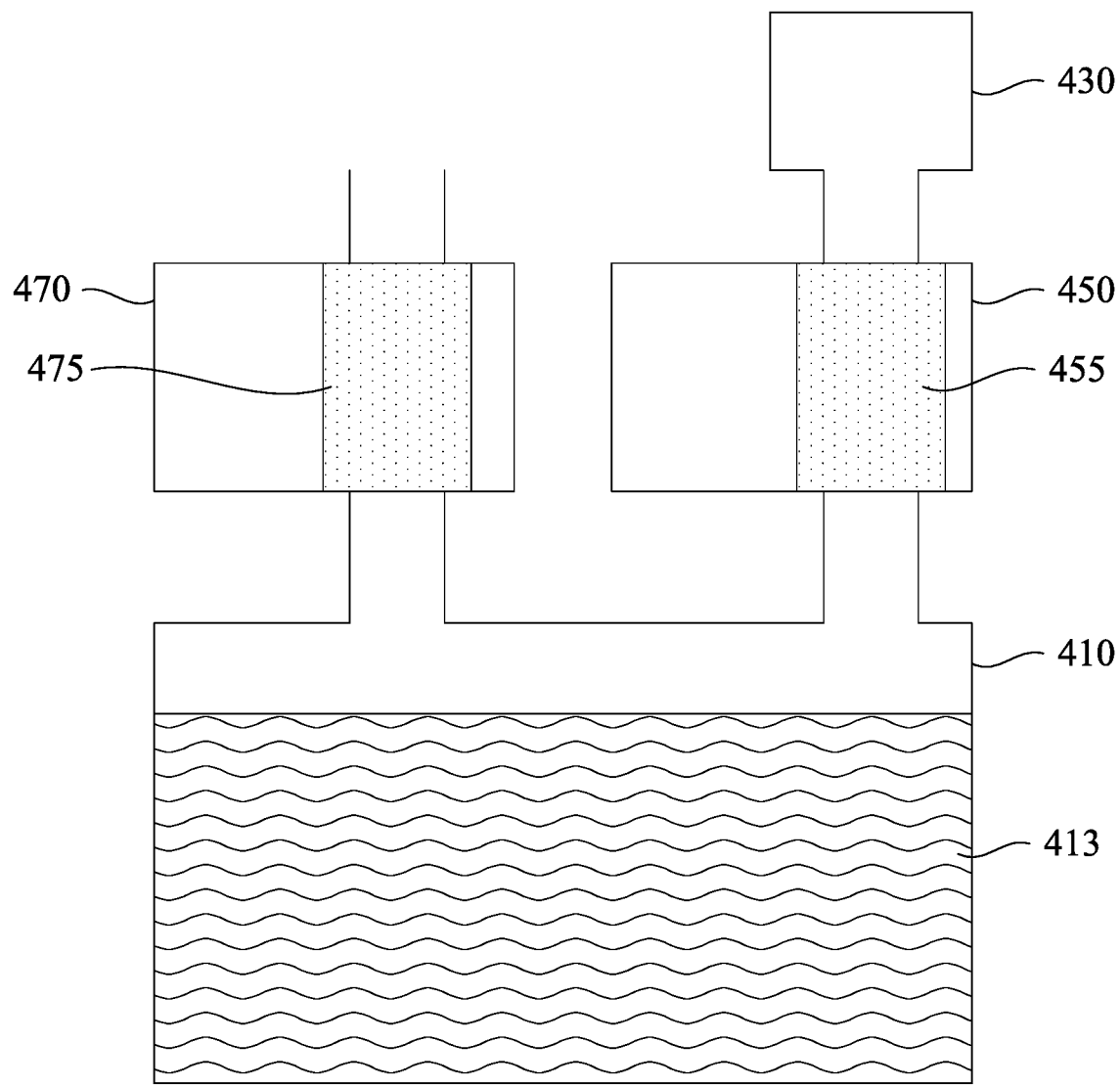
Figure 5C:
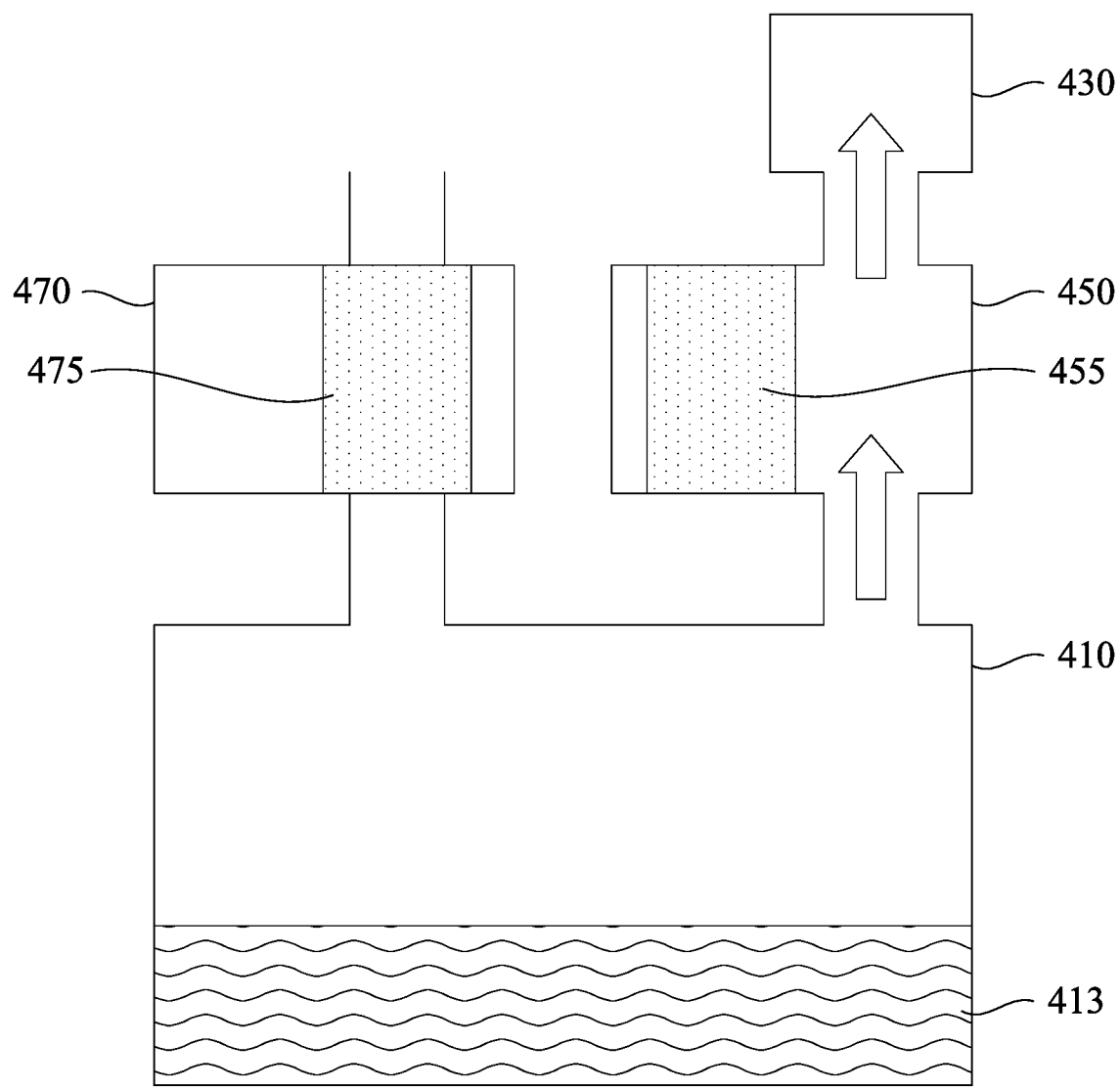

Please refer to FIG. 5A to FIG. 5C. FIGS. 5A-5C are schematic views respectively illustrating pistons 455 and 475 of solenoid valves 450 and 470 at a first location, a second location, and a third location in another cooling device 400 according to an embodiment of the present invention.

Refer to FIG. 5A, a specific structure of the cooling device 400 is provided. As shown in FIG. 4, the cooling device 400 includes a tank 410, a bellow 430, a solenoid valve 450 and a solenoid valve 470. The tank 410 contains a coolant 413. The solenoid valve 450 and the solenoid valve 470 are two two-hole two-position solenoid valves. The solenoid valve 450 has a piston 455, and the solenoid valve 450 is connected between the bellow 430 and the tank 410 and configured to cause the tank 410 to be selectively communicated with the bellow 430. The solenoid valve 470 has a piston 475. The solenoid valve 470 is communicated with the tank 410 and configured to cause the tank 410 to be selectively communicated with an external space. The solenoid valve 450 and the solenoid valve 470 can be controlled by a processor.

Corresponding to the first location illustrated in FIG. 2A, in FIG. 5A, the piston 455 of the solenoid valve 450 closes the communication between the tank 410 and the bellow 430, and the tank 410 still communicates with the external space. Thus, the gas can flow from the tank 410 to the external space as shown by the arrow in FIG. 5A.

Corresponding to the second location illustrated in FIG. 2B, in FIG. 5B, the piston 455 closes the communication between the tank 410 and the external space, and the piston 475 closes the communication between the tank 410 and the bellow 430.

Corresponding to the third location illustrated in FIG. 2C, in FIG. 5C, the piston 475 of the solenoid valve 470 closes the communication between the tank 410 and the external space, and the tank 410 still communicates with the bellow 430. Thus, the gas can flow from the tank 410 to the bellow as shown by the arrow in FIG. 5C.

Therefore, the operation 200 can be achieve through the two two-hole two-position solenoid valve 450 and 470 of the cooling device 400. In other words, similar to the cooling device 100, the cooling device 400 can also reduce the space occupied by the bellow 430, thereby reducing the space occupied by the entire cooling device 400.

In summary, the cooling device of the present invention can effectively save the space occupied by the bellow storing the vaporized coolant through excluding the gas that does not need to be stored by designing and controlling the solenoid valve, and further reducing the space occupied by the overall cooling device. When the pressure in the tank needs to be adjusted to normal pressure, the solenoid valve can cause the tank communicating with the external space to supplement the external gas, and most of the external gas can be eliminated by the solenoid valve without occupying an additional space of the bellow. The structure of the solenoid valve can be a single three-hole three-position solenoid valve or a combination of two two-hole two-position solenoid valve. Thus, the cooling device takes up less space, and the improved cooling device is more easily applied to other devices that require heat dissipation functions.

Although the present invention has been described in considerable detail with reference to certain embodiments thereof, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A cooling device, configured to cool a heat source, the cooling device comprising:
   a tank, containing a coolant, wherein the heat source is immersed in the coolant;
   a bellow; and
   a solenoid valve, connected to the tank and the bellow, wherein the solenoid valve comprises:
   a first channel, connected to the tank;
   a second channel, connected to the bellow;
   a third channel, connected to an external space; and
   a piston, configured to seal the second channel and the third channel, wherein the piston is configured to connect the first channel to one of the second channel and the third channel,
   wherein the piston is moved to connect the first channel to the third channel when the heat source is initially activated, and the piston is moved to connect the first channel to the second channel when the heat source operates.

2. The cooling device of claim 1, further comprising:
   a temperature sensor, connected to the tank, wherein the temperature sensor is configured to detect a temperature of the coolant.

3. The cooling device of claim 2, further comprising a processor connected to the solenoid valve, wherein the processor is configured to control a position inside the solenoid valve according to the temperature of the coolant, and the piston is moved to connect the first channel to the second channel when the temperature of the coolant reaches a threshold temperature.

4. The cooling device of claim 1, further comprising:
   a pressure sensor, connected to the tank, wherein the pressure sensor is configured to detect a pressure in the tank.

5. The cooling device of claim 4, further comprising a processor connected to the solenoid valve, wherein the processor is configured to control a position of the piston inside the solenoid valve according to the pressure in the tank, whereby the piston is moved to connect the first channel to the third channel when the pressure in the tank reaches a threshold value.

6. The cooling device of claim 1, wherein the solenoid valve further comprises:
   a valve chamber, fluidly communicated with the first channel, the second channel and the third channel, wherein the first channel and the third channel are respectively disposed at two opposite side of the valve chamber, the piston is configured to separate the valve chamber into a first chamber and a second chamber that are fluidly isolated from each other.

7. The cooling device of claim 6, wherein the piston is configured to be moved to a first location, a second location or a third location of the valve chamber, the piston is configured to seal the second channel to connect the first channel to the third channel when the piston is at the first location, the piston is configured to seal the first channel when the piston is at the second location, and the piston is configured to seal the third channel to connect the first channel to the second channel when the piston is at the third location.

8. The cooling device of claim 7, further comprising a processor connected to the solenoid valve, wherein the processor is configured to cause the piston to be located at one of the first location and the third location when the solenoid valve powers on.

9. The cooling device of claim 6, further comprising a processor connected to the solenoid valve, wherein the processor is configured to cause the piston to be located at a sealing position where the piston seals the first channel, and the first chamber is connected to the second channel and the second chamber is connected to the third channel.

* * * * *